US006881687B1

(12) United States Patent
Castrucci

(10) Patent No.: US 6,881,687 B1
(45) Date of Patent: Apr. 19, 2005

(54) METHOD FOR LASER CLEANING OF A SUBSTRATE SURFACE USING A SOLID SACRIFICIAL FILM

(76) Inventor: Paul P. Castrucci, 41 Pheasant Way, South Burlington, VT (US) 05403

( * ) Notice: Subject to any disclaimer, the term of this patent is extended or adjusted under 35 U.S.C. 154(b) by 0 days.

(21) Appl. No.: 09/429,869

(22) Filed: Oct. 29, 1999

(51) Int. Cl.[7] .............................. B08B 3/12; B08B 7/00
(52) U.S. Cl. ............................. 438/940; 134/1; 219/68; 219/85
(58) Field of Search ....................... 219/121.68, 121.69, 219/121.85; 134/1; 438/940; 216/65

(56) References Cited

U.S. PATENT DOCUMENTS

| | | | |
|---|---|---|---|
| 3,464,534 A | 9/1969 | Muncheryan | 197/181 |
| 4,028,135 A | 6/1977 | Vig et al. | 134/1 |
| 4,181,538 A | 1/1980 | Narayan et al. | 148/1.5 |
| 4,292,093 A | 9/1981 | Ownby et al. | 357/59 |
| 4,590,094 A | 5/1986 | Ringer, Jr. | 427/82 |
| 4,680,616 A | 7/1987 | Delahoy et al. | 357/59 |
| 4,867,796 A | 9/1989 | Asmus et al. | 131/1 |
| 4,980,536 A | 12/1990 | Asch et al. | 219/121.68 |
| 4,987,286 A | 1/1991 | Allen | 219/121.68 |
| 5,024,968 A | 6/1991 | Engelsberg | 437/173 |
| 5,061,604 A | * 10/1991 | Ouderkirk et al. | 430/296 |
| 5,099,557 A | 3/1992 | Engelsberg | 29/25.01 |
| 5,151,135 A | 9/1992 | Magee et al. | 134/1 |
| 5,283,417 A | 2/1994 | Misawa et al. | 219/121.85 |
| 5,332,879 A | 7/1994 | Radhakrishnan et al. | 219/121.69 |

(Continued)

OTHER PUBLICATIONS

H.K. Park et al., A Practical Excimer Laser–Based Cleaning Tool for Removal of Surface Contaminants. IEEE 1994, pp. 631–643.*

Bedair et al., "Atomically Clean Surfaces by Pulsed Laser Bombardment" J. Applied Physics, vol. 10, No. 12 (Nov. 1969).

Philip E. Ross, "Dust Busters: Laser Light Submicron Motes from Silicon Wafers" Scientific American 1980, vol. 262 No. 6, pp. 86–88.

(Continued)

Primary Examiner—Long Pham
Assistant Examiner—Anh Duy Mai
(74) Attorney, Agent, or Firm—AKC Patents, LLC; Aliki K. Collins

(57) ABSTRACT

An improved semiconductor wafer processing apparatus 10 includes a series of processing stations combined in one form, coupled together by computer-controlled cluster tooling. Wafers are supplied in a pod to an input station 28 which initiates a data record for recording processing results at each station. A sacrificial film 140 is applied to the surface 135 of each wafer. Individual wafers are transferred to a computer-controlled defect-mapping station 14 where particulate defects 130 are identified and their position coordinates recorded. Defect-mapped wafers are transferred to a computer-controlled laser area cleaning station 11 which lifts the defects and sweeps the wafer surface clean, except for stubborn defects. Clean wafers are transferred to a final mapping station 20 or 22, followed by transfer of the wafers to an output station 30. Wafers having remaining stubborn defects are transferred to a second defect-mapping station 16 where stubborn defects are located by coordinates, after which the wafers are transferred to a defect review tool incorporating a scanning electron microscope (SEM-DRT) 24. A SEM image review of stubborn defects includes chemical analysis of the stubborn defects. A laser point-cleaning station 13 lifts and sweeps each stubborn defect individually from the wafer surface. Cleaned wafers are transferred to a third defect-mapping station 18 for recording any stubborn defects remaining, then to a second laser area cleaning station 12 for a final cleaning, followed by transfer of the wafers to a final mapping station 20 or 22 for mapping of any remaining stubborn defects. The accompanying data records are updated followed by transfer of the wafers to an output station 30.

42 Claims, 9 Drawing Sheets

U.S. PATENT DOCUMENTS

| | | | |
|---|---|---|---|
| 5,366,559 A | 11/1994 | Periasamy | 134/1 |
| 5,393,957 A | 2/1995 | Misawa et al. | 219/171.85 |
| 5,466,908 A | 11/1995 | Hosoya et al. | 217/121.68 |
| 5,482,561 A | 1/1996 | Yeung et al. | 134/1 |
| 5,499,668 A | 3/1996 | Katayama et al. | 134/1 |
| 5,531,857 A | 7/1996 | Engelsberg et al. | 156/345 |
| 5,592,879 A | 1/1997 | Waizmann | 101/416.1 |
| 5,637,245 A | 6/1997 | Shelton et al. | 219/121.85 |
| 5,643,472 A | 7/1997 | Engelsberg et al. | 216/65 |
| 5,656,096 A | 8/1997 | Van Alstyne | 134/1 |
| 5,669,979 A | 9/1997 | Elliott et al. | 134/1 |
| 5,681,395 A | 10/1997 | Werner | 134/1 |
| 5,751,897 A | 5/1998 | Van Alstyne | 392/419 |
| 5,800,625 A | 9/1998 | Engelsberg et al. | 134/1 |
| 5,814,156 A | 9/1998 | Elliott et al. | 134/1 |
| 5,821,175 A | 10/1998 | Engelsberg | 438/795 |
| RE35,981 E | 12/1998 | Nagy et al. | 219/121.68 |
| 5,958,268 A | 9/1999 | Engelsberg et al. | 219/121.84 |

OTHER PUBLICATIONS

Author unknown, "Laser Activated Cleaning and Etching System and Method" IBM Technical Disclosure Bulletin Dec. 1982, pp. 3775–3776.

W. Zapka and A. Tam, "Particulate Removal from a Surface by Excimer Laser Radiation" CLEO 1990 Technical Digest, Series vol. 7 pp. 226–229 (1990).

K. Imen, S. J. Lee, and S. D. Allen, "Laser Assisted Micron Scale Particulate Removal" CLEO 1990 Technical Digest, Series vol. 7 pp. 228–229 (1990).

K. Imen, S. J. Lee, and S. D. Allen "Laser–assisted micron scale particle removal" Applied Physics Letters vol. 58 Jan. 1991, p. 203–205.

W. Zapka, W. Ziemlich, and A. C. Tam, "Efficient pulsed laser removal of 0.2 mm gold particles from a surface," Applied Physics Letters vol. 58 No. 20, p. 2217–2219 (May 1991).

Author unknown, "Elimination of Surface Debris in Laser Ablation of Polymers" IBM Technical Disclosure Bulletin, vol. 34, No. 4B, Sep. 1991, p. 233.

Author unknown, "Laser Cleaning of a Delicate (Easily Laser Damaged) Surface" IBM Technical Disclosure Bulletin, Jun. 1992, pp. 70–71.

Author unknown "Fast Laser Steam Cleaning by Continuous Film Deposition and Pulsed Laser Irradiation of a Moving Surface" IBM Technical Disclosure Bulletin, vol. 39 No. 3 (Mar. 1996) pp. 175–176.

A. Engelsberg "Laser–Assisted Cleaning Proves Promising" Precision Cleaning, May 1995.

R. Ariail "A Professional Method for Cleaning Optics" reprint of Journal of the Antique Telescope Society Spring/Summer 1995.

D. J. Elliott et al., "Deep UV–Photoreactive Cleaning with Catadioptric Projection Optics and Reactive Gases" Future Fab International (date unknown).

B. Livshits et al., "Laser, dry and plasmaless, photoresist removal" Solid State Technology, Jul. 1997, pp. 197–202.

A. C. Tam et al., "Laser–cleaning techniques for removal of surface particulates" J. Applied Physics, vol. 71 No. 7, pp. 3515–3523.

* cited by examiner

METHOD FOR LASER CLEANING OF A SUBSTRATE SURFACE USING A SOLID SACRIFICIAL FILM

CROSS-REFERENCE TO RELATED APPLICATIONS

This application is related to U.S. provisional patent application Ser. No. 60/047,907 filed in the United States Patent and Trademark Office on 29 May 1997 and to international patent application PCT/US98/10658 filed on 26 May 1998.

TECHNICAL FIELD

This invention relates to manufacturing methods and apparatus for cleaning semiconductor wafers and the like. More particularly, this invention relates to methods and apparatus for acquiring and for using information about location of particulate defects and relates to methods using a sacrificial film and laser irradiation to remove small particles.

BACKGROUND ART

The semiconductor industry is moving into the 21st century with accelerating technological speed driven by small feature sizes and large wafers. This advanced technology capability will become increasingly more difficult to harness and more costly to implement. The Semiconductor Industry Association (SIA) Road map projects that the 0.18 micron/300 mm wafer technology generation in 2001 will require a level of 0.01 defects/cm$^2$ to produce high yield IC products. Not only is this density very low (⅔ defects per 300 mm wafer), but particles as small as 0.06 micrometer (approximately 100 atoms) in diameter can cause electrical IC product failures. Low defect levels are critical for economic success in the IC industry. Table 1 illustrates the effect of defect density level on test yield for several 0.18 micron products: A dynamic RAM memory (DRAM) of 1 Gigabits per chip, a 1000 MIP microprocessor, and a system-on-a-chip IC product (SOC). An increase of defect density (microprocessor) from 0.01 D/cm$^2$ to 0.05 D/cm$^2$ reduces the test yield from 70% to 12%. The IC industry's future economic success will have strong dependency on its ability to develop technology of tool systems that maintain very low defect levels, even as the industry produces finer and finer feature sizes. This yield analysis focuses on three products: DRAM, microprocessor, and system on a chip. Test yields were rigorously calculated for these three products and three technology generations—0.35 micron, 0.25 micron, and 0.10 micron. Table 2 illustrates the specific yields utilized in the study. The IC industry needs technology tools that will eradicate defects in order to achieve the very low defect levels required, even as the industry produces finer and finer feature sizes.

Surface contaminant defects include discrete pieces of matter that range in size from submicron dimension to granules visible to observation with the unaided eye. Such contaminants may be fine dust, dirt particles, or unwanted molecules comprised of elements such as carbon, hydrogen, and/or oxygen. Particulate contaminants ("particulates") frequently adhere to a surface by weak covalent bonds, electrostatic forces, van der Waals forces, hydrogen bonding, coulombic forces, or dipole-dipole interactions, making removal of the particulates difficult. Particulates frequently encountered in practice include polysilicon slivers, photoresist particles, metal oxide particles, metal particles, and slurry residue. It is known that not all particulates are equally undesirable. For example, particulates that adhere at some non-sensitive portions of the IC circuitry may have no effect on operation or performance and need not necessarily be removed ("don't cares"). On the other hand, particulates that adhere at critical locations ("killer defects") can cause failure of the IC circuitry and must be removed for proper operation. In certain instances, the presence of surface contaminants renders the contaminated substrate less efficient or inoperable for the substrate's designated purpose. In semiconductors, surface defects due to minor molecular contaminants often render semiconductor masks or chips worthless. As shown by Tables 1 and 2 below, reducing the number of molecular surface defects on a semiconductor wafer by even a small amount can radically improve semiconductor chip test yields. Similarly, removing molecular surface contaminants, such as carbon or oxygen, from the surface of silicon wafer circuit layers as deposited on the wafer or between deposition of layers significantly improves the quality of the IC chip produced.

TABLE 1

| Product | Defect Density | Test Yield |
| --- | --- | --- |
| 1 Gigabit DRAM | 0.01 Defect/cm$^2$ | 81% |
| 1 Gigabit DRAM | 0.03 Defect/cm$^2$ | 53% |
| 1 Gigabit DRAM | 0.10 Defect/cm$^2$ | 12% |
| Microprocessor (1000 MIP) | 0.01 Defect/cm$^2$ | 70% |
| Microprocessor (1000 MIP) | 0.03 Defect/cm$^2$ | 28% |
| Microprocessor (1000 MIP) | 0.05 Defect/cm$^2$ | 12% |
| System on a Chip (SOC) | 0.01 Defect/cm$^2$ | 64% |
| System on a Chip (SOC) | 0.03 Defect/cm$^2$ | 25% |
| System on a Chip (SOC) | 0.04 Defect/cm$^2$ | 12% |

TABLE 2

| Product | Size | Defect/cm$^2$ | Maximum Yield |
| --- | --- | --- | --- |
| 64M DRAM | 0.35 micrometer | 0.05/cm$^2$ | 67% |
| 200 MIP Microprocessor | 0.35 micrometer | 0.05/cm$^2$ | 42% |
| SOC | 0.35 micrometer | 0.05/cm$^2$ | 27% |
| 256 DRAM | 0.25 micrometer | 0.03/cm$^2$ | 70% |
| 600 MIP Microprocessor | 0.25 micrometer | 0.03/cm$^2$ | 46% |
| SOC | 0.25 micrometer | 0.03/cm$^2$ | 35% |
| 1 G DRAM | 0.18 micrometer | 0.01/cm$^2$ | 81% |
| 1000 MIP Microprocessor | 0.18 micrometer | 0.01/cm$^2$ | 70% |
| SOC | 0.18 micrometer | 0.01/cm$^2$ | 64% |

The need for clean surfaces, free of even the finest contaminants, has led to the development of a variety of currently used surface cleaning methods. These known methods, however, each have their own serious drawbacks. For example, widely used chemical and mechanical cleaning techniques require the use of cleaning tools and agents that can introduce as many new contaminants to a treatment surface as they remove. Another currently used method for cleaning substrate surfaces without outside agents requires that the treatment surface be melted to release contaminants which are then removed by ultra high vacuum pressure. This method has the disadvantage that the surface being treated must be briefly melted, which may be undesirable, as for example, when a semiconductor surface is cleaned between deposition of circuit layers and it is desired that the integrity of the previously deposited layers not be disturbed. A further disadvantage with this process is that ultra high vacuum equipment is both expensive and time consuming to operate. Annealing treatment methods suffer similar drawbacks. When a surface is cleaned by annealing methods, the treatment surface of the substrate being cleaned is heated to a temperature that is generally below the melting point of the material being treated but high enough to enable rearrangement of the material's crystal structure. The surface being treated is held at this elevated temperature for an extended period during which time the surface molecular structure is rearranged and contaminants are removed by ultra high vacuum. Annealing cleaning methods cannot be used where it is desired to preserve the integrity of the existing structure being cleaned.

Another currently utilized cleaning method, known as ablation, suffers from its own particular drawbacks. With ablation, a surface or contaminants on a surface are heated to the point of vaporization. Depending on the material being ablated, the material may melt before being vaporized, or the material may sublimate directly on heating. With ablation cleaning techniques, if damage to the treatment surface is to be prevented, the ablation energy must be exactly aimed toward contaminants rather than toward the surface on which the contaminants lie, a difficult task when the contaminants are extremely small or randomly spaced. Even where the ablation energy can be successfully directed at a contaminant, it is difficult to vaporize the contaminant without also damaging the underlying surface being treated.

Various other techniques for cleaning semiconductor surfaces and the like have been described in the background art. An article by Bedair et al., "Atomically Clean Surfaces by Pulsed Laser Bombardment," J. Applied Physics, Vol. 10 No. 12 (Nov. 1969), describes research using low-energy electron diffraction (LEED) to investigate use of high-power Q-spoiled pulsed lasers for cleaning Ni and Si crystal surfaces in vacuum. Some conditions in this research produced irreparable surface damage.

An article by McKinley et al., "Atomically Clean Semiconductor Surfaces Prepared by Laser Radiation," J. Physics D: Appl. Phys., Vol. 13 (1980), pp. L193–L197, describes preparation of atomically clean surfaces using laser radiation.

The article by Philip E. Ross in Scientific American 1980, vol. 262 No. 6, pp. 86–88, "Dust Busters: Laser Light Submicron Motes from Silicon Wafers," summarizes some research directed toward developing methods of cleaning particles from semiconductor wafers, including methods of Susan D. Allen, methods of Werner Zapka and Andrew C. Tam, and methods of Robert J. Baseman and Douglas W. Cooper.

In IBM Technical Disclosure Bulletin, December 1982, pp. 3775–3776, an article, "Laser Activated Cleaning and Etching System and Method," describes a system which provides a laser-activated gas which reacts with the surface of a sample to clean the surface or to thin the surface. The gas reacts locally with the surface in the regions irradiated by the laser. For example, gaseous $SF_6$ reacts with Si in response to a focussed argon ion laser irradiating a Si surface.

An article by K. Imen, S. J. Lee, and S. D. Allen, "Laser-assisted Micron Scale Particle Removal," Applied Physics Letters , Vol. 58, January 1991, p. 203–205, describes a laser-assisted particle removal technique in which the contaminated substrates were dosed with water, which preferentially adsorbs in the capillary spaces under and around the particles. The substrates were then subsequently irradiated with transverse, electric, atmospheric $CO_2$ laser pulses. At the $CO_2$ laser wavelength, the beam energy is mainly absorbed in the water and not in the substrate.

W. Zapka, W. Ziemlich, and A. C. Tam, "Efficient Laser Removal of 0.2 mm Gold Particles from a Surface," Applied Physics Letters, Vol. 58 No. 20, p. 2217–2219 (May 1991), describes laser cleaning with pulsed ultraviolet and infrared lasers in which a liquid film of thickness on the order of a micron is deposited on the surface (only at the irradiation location) with a pulsed deposition of liquid just before the pulsed laser irradiation. The liquids tried were water, ethanol, and isopropanol. Zapka et al. recommend that it is generally preferable to choose the incident laser wavelength to be strongly absorbed by the substrate, rather than by the thin water film or by the material of the small particle.

In IBM Technical Disclosure Bulletin, June 1992, pp. 70–71, an article, "Laser Cleaning of a Delicate (Easily Laser Damaged) Surface," describes a technique involving pulsed deposition of liquid droplets onto the particulates on the surface together with pulsed laser irradiation at large incidence angle (typically larger than 45°). This publication also refers to several other articles related to the background art, including W. Zapka and A. Tam, "Particle Removal from a Surface by Excimer Laser Radiation," rut published in CLEO 1990 Technical Digest, Series Vol. 7 pp. 227–228 (1990), and in the same publication at pp. 228–229 an article by K. Imen, S. J. Lee and S. D. Allen, "Laser Assisted Micron Scale Particulate Removal."

In IBM Technical Disclosure Bulletin, Vol. 39 No. 3 (March 1996) pp. 175–176 an article, "Fast Laser Steam Cleaning by Continuous Film Deposition and Pulsed Laser Irradiation of a Moving Surface," describes an apparatus for laser steam cleaning of surfaces. A part to be cleaned is moved continuously as a thin liquid film approximately one micrometer thick is continuously deposited on its surface using a nozzle, while pulsed laser radiation is applied downstream to superheat the liquid film, producing steam cleaning action.

An article by Tam et al., "Laser Cleaning Techniques for Removal of Surface Particles," Journal of Appl. Phys., Vol. 71 No. 7, p. 3515 ff., the entire disclosure of which is incorporated herein by reference, describes experiments that employed flash laser heating, using short-pulsed laser irradiation of a surface for effective removal of particulate contaminations of sizes as small as 0.1 micrometer. The pulsed laser radiation was used with or without the simultaneous deposition of a thin liquid film on the surface to be laser cleaned. Table 3, from the article by Tam et al., lists a number of cleaning methods for removing small particles, along with lower limits of particle diameters and the likelihood of destroying sensitive parts. The highest efficiency method found by Tam et al. included choosing a laser wavelength that is strongly absorbed by the surface together with pulse-depositing a water film of thickness on the order of microns onto the surface shortly before the pulsed laser irradiation. This permitted the effective removal of particles smaller than about 20 micrometers, down to as small as 0.1 micrometer, from a solid surface using a modest ultraviolet laser fluence of 0.1 J/cm2.

TABLE 3

Cleaning method limitations (Prior art) from Tam et al.

| Method | Lower limit of diameter of particles removed (micrometers) | Likelihood of destroying sensitive parts |
| --- | --- | --- |
| Ultrasonic cleaning | 25 | yes |
| Wiping | 5 | yes |
| Brush scrubbing | 0.5 | yes |
| High-pressure jet spraying (4000 psi) | 0.5 | yes |
| Etching | 0.5 | |
| High-pressure jet spraying (10,000 psi) | 0.3 | yes |
| High-pressure jet spraying (15,000 psi) | 0.2 | yes |
| Megasonic cleaning | 0.2 | |

The semiconductor industry has a continuing need for cleaning methods with improved performance in removing the smallest-diameter particulate contaminants, especially those with diameters of less than about 0.2 micrometer. For particulate contaminants with diameters of more than about 0.2 micrometer, megasonic cleaning is available. Conventional methods are not adequate for the smallest achievable device structures or for the highest desired cleaning standards. Another desirable improvement is in the reduced or eliminated need for deionized water.

Surface cleaning by melting, annealing, and thermal ablation can be conducted with a laser energy source. However, using a laser energy source to remove contaminants from a surface by melting, annealing or thermal ablation does not overcome the inherent disadvantages or these processes. For example, in U.S. Pat. No. 4,292,093, "Method Using Laser Irradiation For the Production of Atomically Clean Crystalline Silicon and Germanium Surface," the laser annealing method disclosed requires both vacuum conditions and energy levels sufficient to cause rearrangement and melting of the treatment surface. Other known laser surface cleaning methods involving melting or annealing require similar high energy lasing and/or vacuum conditions, as disclosed in U.S. Pat. Nos. 4,181,538 and 4,680,616. The method of U.S. Pat. No. 3,464,534 suffers the same drawbacks as other high energy laser thermal ablation methods.

The method of U.S. Pat. No. 4,980,536 to Asch et al. uses a high power density excimer laser pulse directed to both front and back sides of a mask to remove small particles. The method of U.S. Pat. No. 4,987,286 to Allen uses an energy transfer medium interposed between each particle to be removed and the surface to which the particle is adhered. The method of U.S. Pat. No. 5,151,135 to Magee et al. uses short pulses of ultraviolet laser light of controlled power density for cleaning single-crystalline and amorphous surfaces. The method of U.S. Pat. Nos. 5,283,417 and 5,393,957 to Misawa et al. uses two lasers, a pulsed laser and a trapping laser, to perform modification and processing of particles and microcapsules. The method of U.S. Pat. No. 5,332,879 to Radhakrishnan et al. for removing trace metal contaminants from organic dielectrics such as polyimide uses pulsed ultraviolet radiation to remove the contaminants by a process of ablation. The method of U.S. Pat. No. 5,637,245 to Shelton et al. uses a laser for cleaning equipment surfaces and provides a barrier layer at the surface to be cleaned. The barrier layer ensures that energy from the laser light is evenly distributed and shields the surface from oxygen to prevent oxidation of the surface.

FIGS. 8 and 9 show a comparison of test yield learning for two cases in fabricating a hypothetical 1000 MHZ semiconductor product having 30 mask levels, with 0.1 8-micrometer minimum critical dimensions. The lower curve 100 of FIG. 8 shows a barrier at about 28% limited yield with 0.03 defects/cm$^2$ for water cleaning. The higher curve 110 of FIG. 9 shows the enabling character of laser cleaning, with 73% yield and in with 0.008 defects/cm$^2$.

OBJECTS AND ADVANTAGES OF INVENTION

An object of the invention is a system that is capable of locating, identifying, and removing individual defects of various sizes, shapes, and compositions from wafer surfaces at various stages in the wafers' fabrication. A related object is a system that is capable of individually locating, identifying, and removing those particular individual defects that are "killer" defects, i.e. those defects that, because of their nature, size, and location at critical portions of a semiconductor product design, would adversely affect device functionality or performance. To achieve these objects, a more practical object is a system that incorporates cleaning apparatus and methods capable of area cleaning of wafers and also adaptable to local selective removal of individual particulates from wafers. A more detailed object is a system including means for creating and maintaining a data record for each wafer indicating location and other characteristics of particles on each wafer, including means for performing a wafer surface cleaning of defects using a sacrificial layer and a photon flux process with gas or vapor cleansing, and also including means for transferring wafers among various stations. Another detailed object is a method for processing wafers including the steps of transferring each wafer to a number of processing stations in a predetermined sequence starting at an input station and ending at an output station, creating and maintaining a data record at each of the stations, mapping and recording the locations of defects on each wafer, cleaning defects from each wafer using a photon flux process followed by vapor cleansing, and transferring the wafers to an output station. These and other objects, features, and advantages will be apparent from a reading of the following description, along with the accompanying drawings and the appended claims.

One aspect of the invention described in international patent application PCT/US98/10658 is a laser-clean yield-enabling system including a laser cleaning operation and a defect inspection operation cooperating to feed information regarding the root cause of the remaining defects back to earlier process stages, for correction of the root causes, with resultant improvement in yield. In a simplest configuration, the particles remaining after a laser cleaning would be characterized as to their types, sizes, shapes, densities, locations, and chemical compositions in order to deduce the root causes of the presence of those particular particles. This information is used to improve the yield of subsequent product wafers being processed so that their yields are higher than the wafers characterized. In the present specification, such methods will be termed "feedback" methods because the information about particulate contaminants' characteristics is fed back to an earlier part of the process for yield improvement in subsequent practice of the earlier part of the process on subsequent wafers.

The improved semiconductor wafer processing apparatus, as described in international application PCT/US98/10658 published as WO 98/54632), includes a series of processing stations, in one form, coupled together by computer-controlled cluster tooling which is programmed to achieve a selected wafer throughput for the apparatus at a selected defect level in the range of at least 0.01 defects/cm$^2$. Wafers are supplied in a pod to an input station which initiates a data record for recording wafer processing results at each processing station and transfers individual wafers to a precleaning station under,control of the wafer handling equipment. The precleaning station performs a self-directed vacuum bake for each wafer after which the pod is transferred to a self-directed defect mapping station where wafer surface defects are identified and located in their x-y coordinates. The defect-mapped wafers are transferred to a self-directed (i.e., computer-controlled) laser area cleaning station which lifts the defects and sweeps the wafer surface clean, except for stubborn defects. Clean wafers are transferred to a final mapping station where the wafer record is updated, followed by transfer of the wafers to an output station. Wafers that have remaining stubborn defects are transferred to a second wafer defect mapping station where the stubborn defects are located in x-y coordinates, after which those wafers are transferred to a self-directed (i.e., computer-controlled) defect review tool incorporating a scanning electron microscope (SEM-DRT). An ultra high power wafer surface SEM image review of stubborn defects is performed including a chemical analysis (by energy-dispersive spectroscopy) of the stubborn defects, after which the wafers are routed to a self-directed (i.e., computer-controlled) laser point cleaning station which addresses each stubborn defect identified by x-y coordinates denoted in the data record accompanying the wafer. The laser point cleaning station performs a defect removal operation by lifting and sweeping each stubborn defect from the wafer surface followed by transferring the cleaned wafers to a third wafer defect mapping station where any stubborn defects remaining are mapped in x-y coordinates and recorded in the accompanying data record, after which these wafers are transferred to a second laser area cleaning station. A final cleaning is performed at the second laser cleaning station followed by transfer of the wafers to a final mapping station for location in x-y coordinates of any remaining stubborn defects. The accompanying data records for the wafers are updated. Finally, the wafers are transferred to the output station.

DISCLOSURE OF INVENTION

The present invention may be used in a "stand-alone" apparatus or may be used in a semiconductor processing apparatus such as that described in international publication WO 98/54632 by Castrucci and Baldwin, the entire disclosure of which is incorporated herein by reference.

An important aspect of the present invention is a defect eradication system in which the defect characterization operation feeds information (especially regarding locations of the particles) forward to a laser cleaning operation which can perform two distinct types of cleaning functions: first a major defect removal process using a selected generic recipe for the cleaning of the major defects characterized, and secondly, a selective laser cleaning directed specifically to particular particles, using a recipe selected for each specific type of particle characterized, and this selective laser cleaning being directed to the locations on the wafer where the specific particles are actually located as determined in the characterization operation. Such methods practiced in accordance with the present invention will be termed "feedforward" methods because the information about particulate contaminants' characteristics is fed forward to a later part of the process to allow targeting of specific particles and particle types and to improve yield on the very same wafers that are characterized. Thus this method differs from and contrasts with the "feedback" methods described hereinabove in that respect.

Another notable aspect of selective particle removal using the methods and apparatus of the invention is that cleaning may be done selectively either (1) at locations where particulate defects are found and mapped by defect characterization methods, or (2) in critical areas selected on the basis that particulate defects in those areas are "killer" defects, or (3) in both of these areas.

Another aspect of the present invention is its use (for removing selected types of defects) of a sacrificial film preferably having a thickness comparable to the radii or diameters of the particles to be removed. The sacrificial film is composed of a film-forming material substantially inert to the substrate to be cleaned. In a preferred process, the sacrificial film comprises a film-forming cellulose ester of nitric acid, the most preferred substance being collodion, a solution of soluble nitrocellulose in a mixture of alcohol and ether, the cellulose nitrate having 11.9% to 12.8% nitrogen, corresponding to a range between a trinitrate and a tetranitrate (pyroxylin). The alcohol-ether mixture in which the soluble nitrocellulose is dissolved may be about one part ethanol and about three to seven parts ethoxyethane or alkoxyalkane. The solvent is preferably allowed to evaporate completely, leaving a film of nitrocellulose, before the laser radiation is applied. It should be mentioned in this regard, that so-called "flexible collodion," which frequently contains camphor and castor oil additives, should not be used in this process when cleaning semiconductor wafers, though it may be suitable for use when cleaning some other types of surfaces. For removal of particles having a size distribution ranging from a smallest diameter to a largest diameter, the film of sacrificial material is preferably applied to a thickness between about one-tenth of the smallest particle diameter and about twice the largest particle diameter. The combination of laser wavelength and pulse width is chosen for absorption of the photons within the thin sacrificial film layer, though some laser light absorption by the surface and/or by the contaminant particles may occur. For the preferred sacrificial film of collodion, the laser wavelength is preferably between about 100 nm and about 700 nm, more preferably about 200 nm, and most preferably about 248 nm (KrF excimer laser), and the pulse repetition rate (overlap) is preferably between about 10–30 pulses/sec., most preferably about 20 pulses/sec.

It is not fully understood why the processes of the present invention produce superior cleaning results in comparison with the prior art, and the invention should not be limited by any particular theory of operation, but some discussion of possible operation theory may be helpful in understanding the invention as a whole. When energy from a suitable incident laser beam is absorbed at a bond holding a contaminant particle on a surface (e.g., by a Van der Waals force), the excess energy above that required to break the bond can be converted to kinetic energy of the particle, causing the particle to leave the surface at high velocity. Thus, if breaking a bond requires energy of 4 eV, and energy of about 6 eV is provided by a laser beam, e.g., at 193 nm wavelength, then about 2 eV of kinetic energy is imparted to the particle leaving the surface. If a stream of inert gas is provided above the surface, the particles flying away from the surface can be entrained in the gas flow and carried away. The smallest contaminant particles are held to the surface by Van der Waals forces proportional to the particle diameter d. It has been found that below about d=0.15–0.2 micrometers, such Van der Waals forces prevent conventional wet cleaning from being effective. Thus, conventional wet cleaning can provide some yield, but that yield is limited if such small particles are present.

The acceleration required to remove particles of diameter d is proportional to $1/d^2$. For dry laser cleaning with a fluence of one Joule/cm², and a laser pulse length of 20 ns, and typical particles with thermal coefficient of expansion of about $10^{-6}$ K⁻and density of 3,000 kg/m³, the thermal expansion within the duration of the laser pulse is about 1 micrometer, giving a velocity of 1 m/s and an acceleration of about 108 m/s. For such processes applied to single particles, optimum cleaning results can be obtained by tailoring the laser beam wavelength and other parameters for each type and size of particle present on the surface, according to the bonding of the particular particle to the ret surface. However, when the surface has a number of different types and sizes of contaminant particles, it may not be possible to set the laser beam parameters simultaneously for cleaning all of the particles with equal effectiveness. The use of a sacrificial film may provide a more uniform bond to the surface, allowing a single set of laser beam parameters to simultaneously remove a variety of particle types and sizes. Under some circumstances, including use of a sacrificial film material with suitable optical refractive index and a suitable angle of incidence of the laser light, it is additionally plausible that refraction of the laser beam in the sacrificial film directs more energy toward the bond between a particle and the underlying surface than without the sacrificial film.

MODES FOR CARRYING OUT THE INVENTION

Description of Preferred Embodiment

Figure 1:
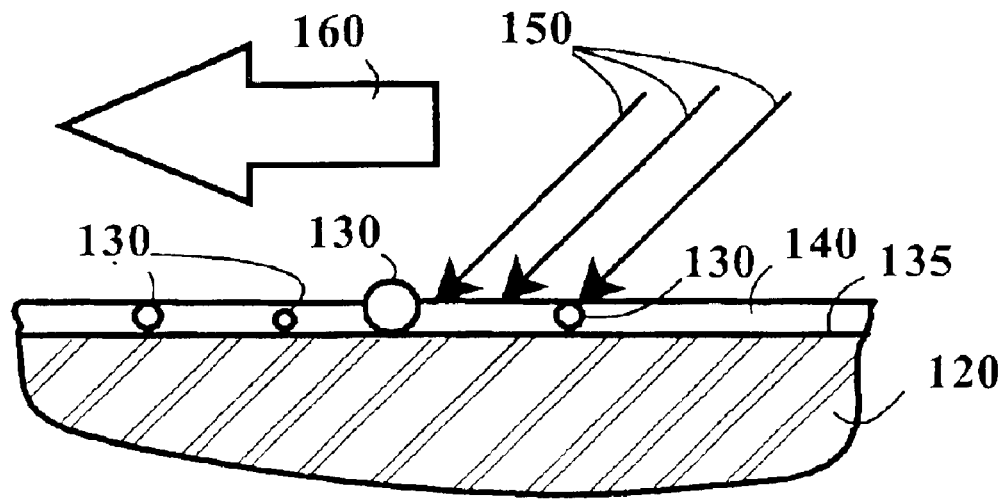
FIG. 1 is a side elevation view schematically illustrating a method performed in accordance with the invention.

The invention employs in part a process (hereafter "Radiance Process"), described in U.S. Pat. No. 5,024,968 to Engelsberg et al., which is based upon the principles of quantum physics rather than chemistry for wafer cleaning purposes. Related methods are described in U.S. Pat. Nos. 5,099,557, 5,531,857, 5,643,472, 5,800,625, 5,821,175, and 5,958,268 to Engelsberg et al. The entire disclosures of U.S. Pat. Nos. 5,024,968, 5,099,557, 5,531,857, 5,643,472, 5,800,625, 5,821,175, and 5,958,268 are incorporated herein by reference. As used in the present invention, the Radiance Process comprises two components:

(1) A photon flux is applied to the surface to be cleaned. This is usually from a deep ultraviolet excimer laser, but Nd:YAG or $CO_2$ lasers are sometimes suitable. The light source and energy and power fluxes are determined by the combination of surface and contaminant. The photon flux provides sufficient energy to break the bonds holding contaminants to a surface. There is currently no predictive model for processing parameters or any agreed upon mechanism by which the process operates. The mechanism has been variously described in terms of interactions including: photodissociation, phonon shock, photophoresis, photon-phonon interaction, acoustic stress waves, or quasi-metastable states. As the photon energy is transferred to the surface-contaminant bonds, bonds break and the contaminants rise above the surface.

(2) To prevent recontamination and the emission of particulate contaminants into the work area surrounding the wafer, the contaminants must be removed from the work area This is accomplished by the use of a flowing gas, usually in a laminar regime to provide a stable boundary layer. The gas, usually nitrogen or argon, must be chosen so as to obviate reactions between it and the surface, noting the photocatalytic effect of some forms of photon flux. The gas may have a role in the process of ejecting the contaminants once they are free of the surface.

Depending upon tool configuration, the process may be applied to a variety of surface configurations ranging from flat surfaces to irregular broken crystals. Processing speed is largely determined by the choice of a particular light source. Process optimization involves tradeoffs of speed, cost, tool size, tool components, and operator involvement. There appears to be a range of processing parameters which can produce the desired cleaning for most applications.

In the present invention, this Radiance process is combined with use of a sacrificial film applied to the wafer or other article to be cleaned, before applying the photon flux from the laser.

A preferred material for the sacrificial layer is collodion. Collodion is prepared as a solution of soluble nitrocellulose in a mixture of alcohol and ether. Soluble nitrocellulose is a product of lower nitration in a reaction of concentrated nitric acid with cellulose (performed in the presence of sulfuric acid, which aids by removing the water produced in the reaction). The reaction of concentrated nitric with cellulose produces various cellulose nitrates (cellulose esters of nitric acid). The number of nitrate groups in the reaction product depends on the treatment. Soluble nitrocellulose contains 11.9% to 12.8% nitrogen, corresponding to the formulas for the trinitrate and the tetranitrate, respectively. The products of higher nitration contain 13% to 13.4% nitrogen, corresponding to the tetranitrate known commercially as guncotton. Such higher nitration products are avoided in preparing collodion for the present process. (The term "pyroxylin" is sometimes used to refer to any product of the reaction of nitric acid with cellulose, and is sometimes restricted to the lower-nitration products.)

The apparatus and method will be described first in terms of a preferred embodiment intended for a complete "high-end" or generic system for use in the earliest stage of a typical semiconductor test yield improvement curve. This earliest regime is indicated by Roman numeral I in FIG. 7.

Figure 7:
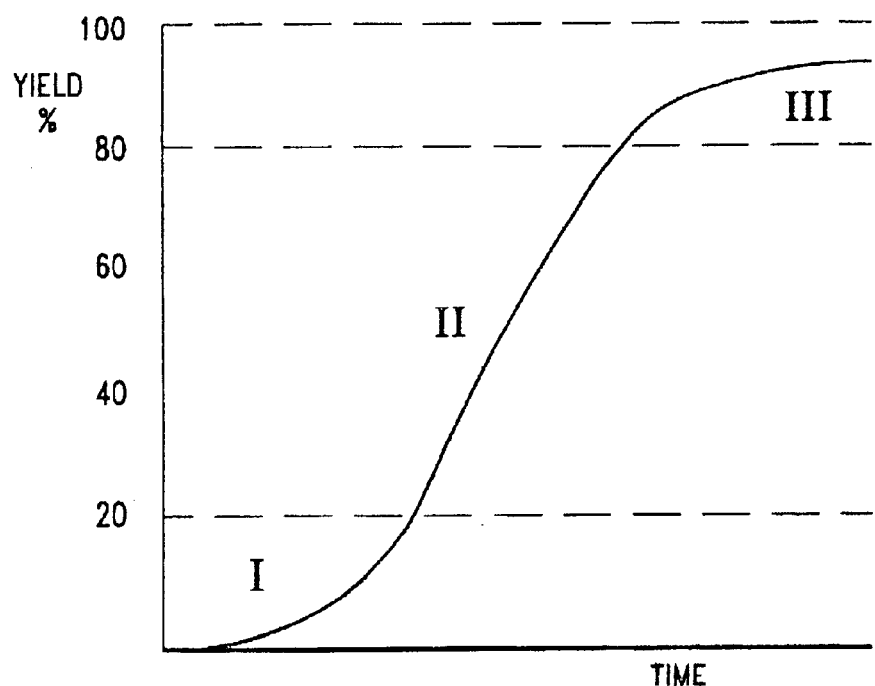
FIG. 7 is a graph illustrating a conventional S-shaped yield leaning curve commonly occurring in semiconductor fabrication.
Figure 8:
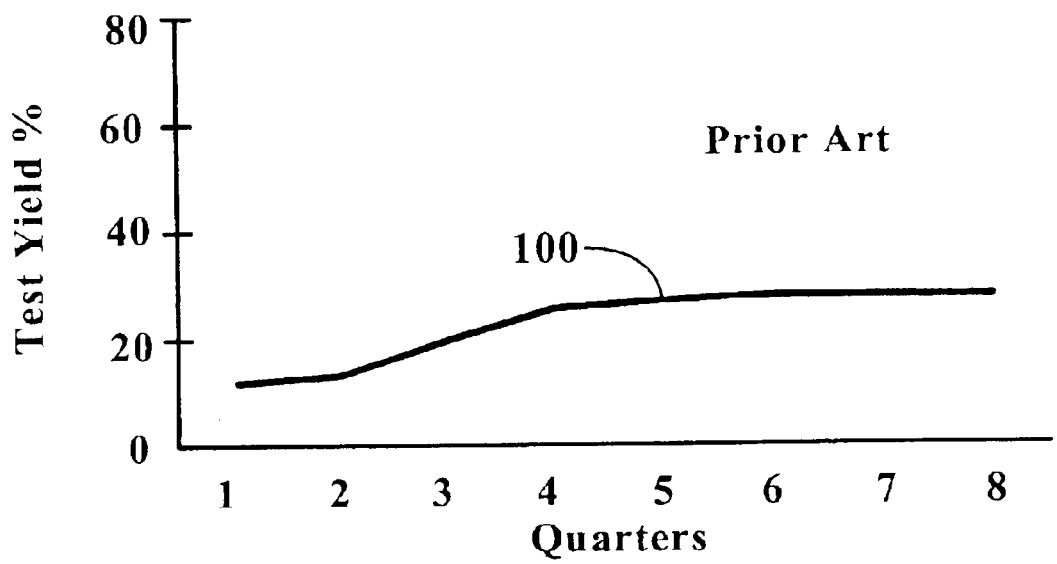
FIG. 8 is a graph illustrating a water clean yield barrier.
Figure 9:
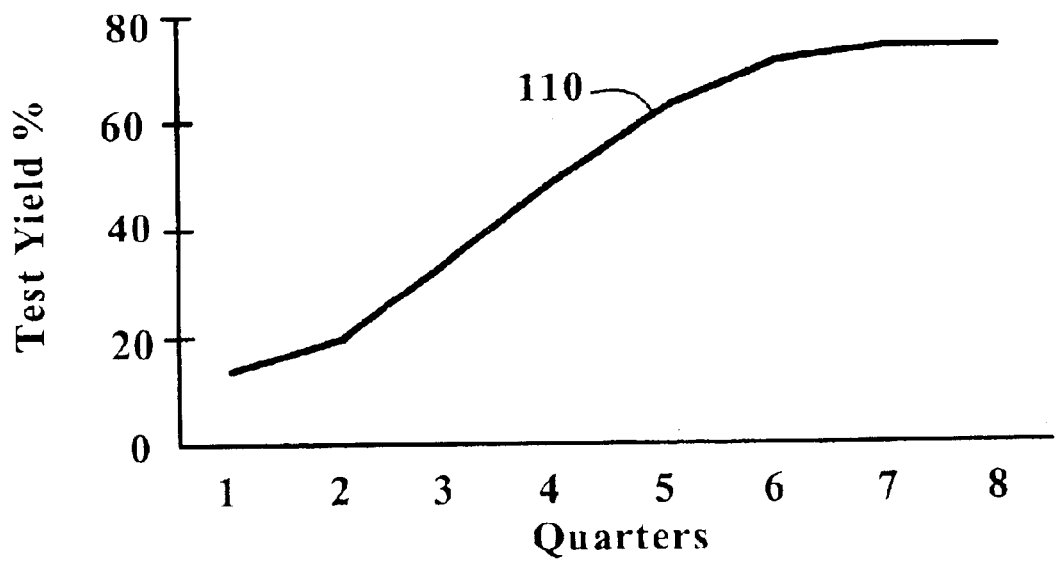
FIG. 9 is a graph illustrating laser clean yield enablement.

A simplified "mid-range" system is then described for use in the intermediate (rapid test-yield-improvement) stage indicated by Roman numeral II in FIG. 7. A further simplified "low-end" system is most useful in the latest (high test yield) stage indicated by Roman numeral m of FIG. 7. While FIG. 7 shows dashed dividing lines between the regimes I, II, and III at approximately 20% and 80% test yield, there is no special quantitative significance to those test yield levels. The test yields at which a transition is made between the three indicated regimes are somewhat arbitrary and may vary with the particular semiconductor product and/or fabrication process. Thus the dividing line between regimes I and II may vary from about 5% test yield to about 30% test yield, for example, with similar variations for the transition from regime II to regime III.

Figure 3A:
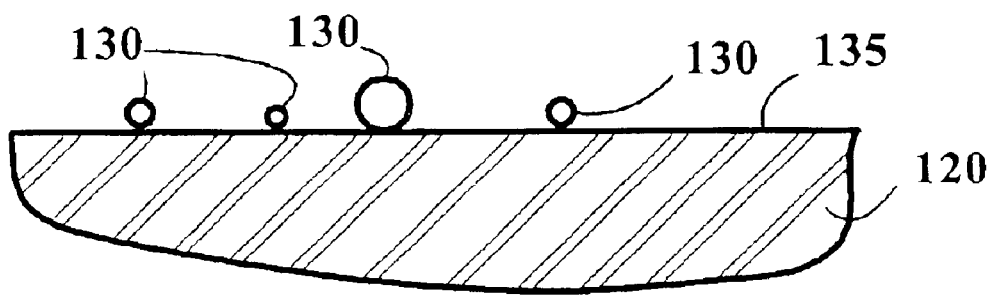
FIGS. 3a–3e are side elevation views schematically illustrating various steps of a first preferred process performed on semiconductor wafers or the like in accordance with the invention.
Figure 3B:
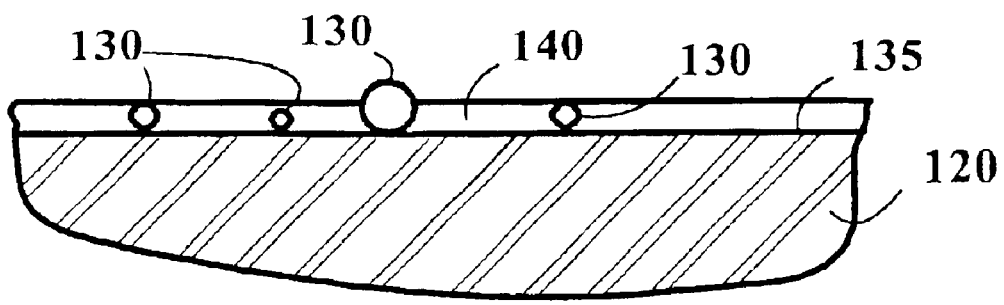
Figure 2:
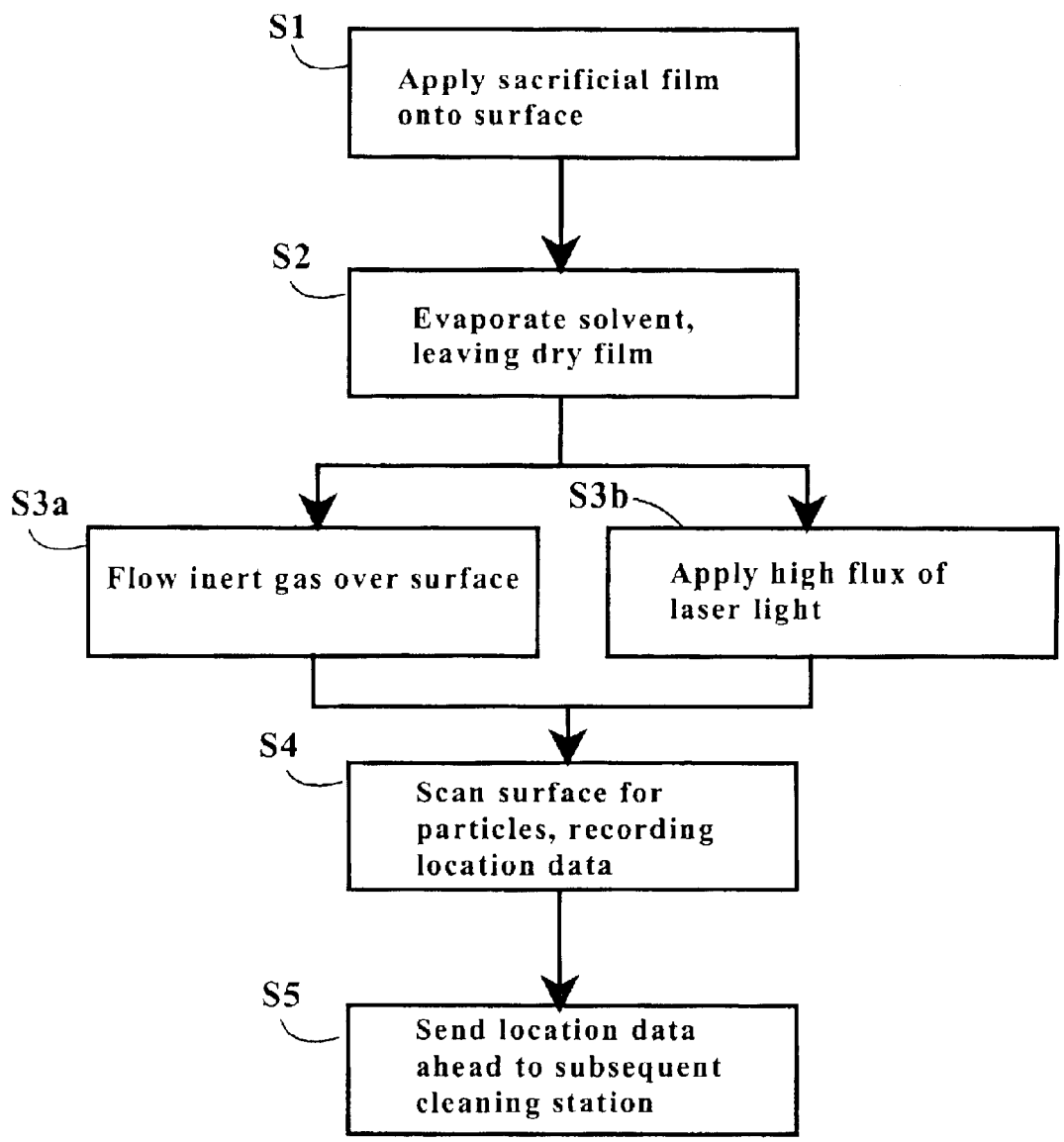
FIG. 2 is a flow chart illustrating the steps of a first preferred process performed on semiconductor wafers or the like in accordance with the invention.
Figure 3C:
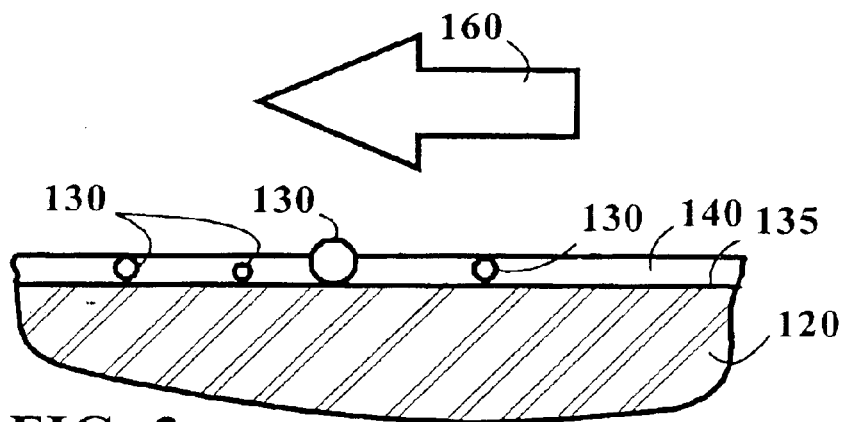
Figure 3D:
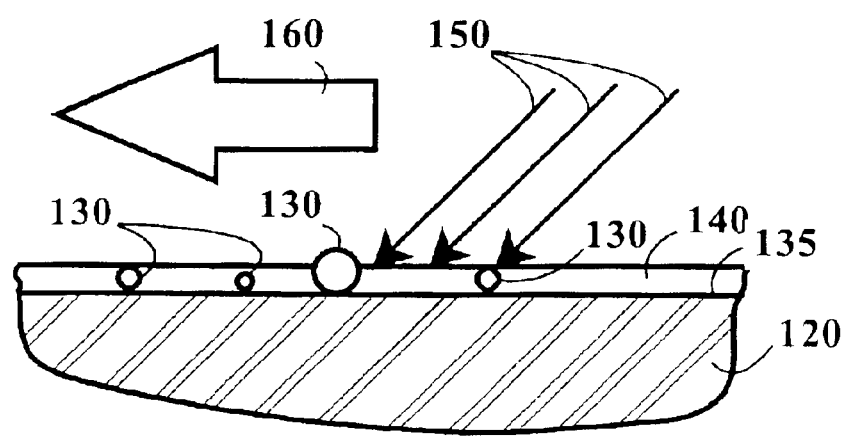
Figure 3E:
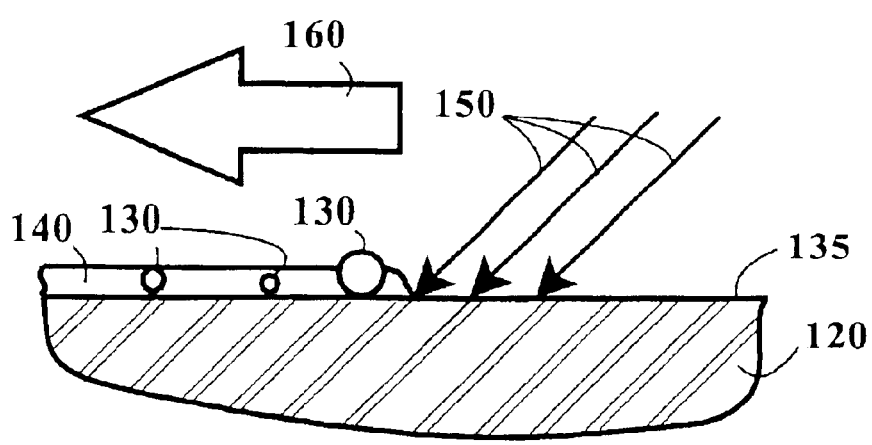

FIG. 1 shows a side elevation view schematically illustrating a method performed in accordance with the invention. FIG. 2 is a flow chart illustrating the steps of a first preferred process performed on semiconductor wafers or the like in accordance with the invention. FIGS. 3a–3e are side elevation views schematically illustrating the various steps of the preferred process of FIG. 2. Referring to FIGS. 1 and 3a, a substrate 120 (having a surface 135) initially has particulate contaminants 130 of various sizes adherent to surface 135. A sacrificial film 140 is applied (step S1) to surface 35. The solvent is evaporated (step S2), leaving a dry film (FIG. 3b). Substrate 120 with its contaminant particles 130 and sacrificial film 140 is initially placed in a vacuum environment. A flow of inert gas (indicated schematically by arrow 160) is provided (step S3a, FIG. 3c), and laser light 150 is applied (step S3b, FIG. 3d). Both sacrificial film 140 and particles 130 are removed and carried away by inert gas flow 160 (FIG. 3e). The surface 135 is scanned for particles 130 remaining on surface 135 and the locations of stubborn particulate defects, if any, are recorded in a data file (step S4). Step S4 may be performed by utilizing a scanning electron microscope—defect review tool (SEM-DRT described hereinbelow) or a wafer mapper 18–22 (also described hereinbelow). Finally, the locations in the data file are sent ahead (step S5) to a subsequent cleaning station, where stubborn particulate defects, if any, are removed individually from those locations. If desired, the locations in the data file may be classified as critical or non-critical, and only the particles at critical locations selectively removed at the subsequent cleaning station. Optionally, criteria other than "criticality" or lack thereof, such as size, shape, color, or composition, may be used to select which particulate defects 130 shall be removed from surface 135.

Figure 4:
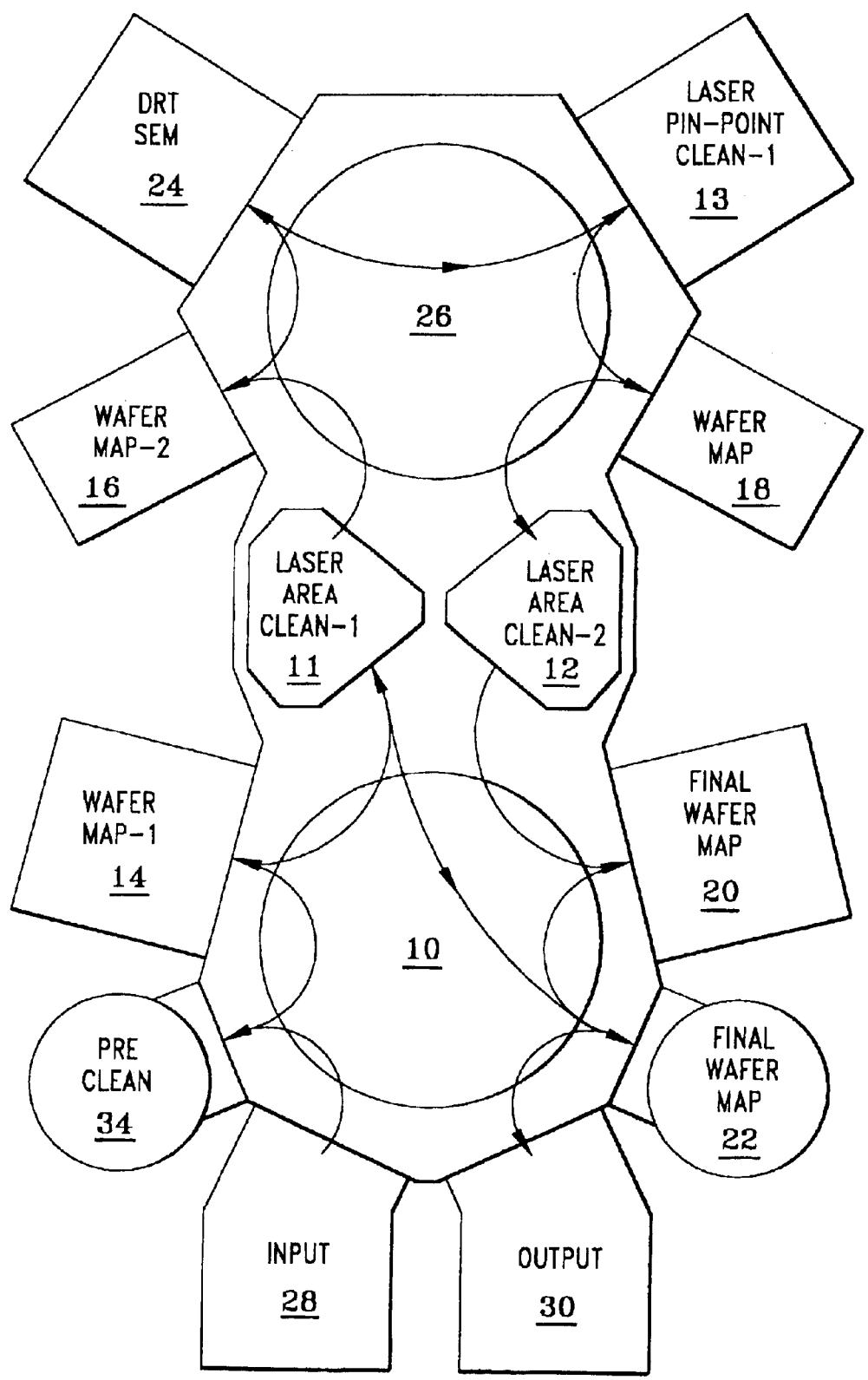
FIG. 4 is a plan view of manufacturing apparatus incorporating the principles of the present invention of defect eradication.

FIG. 4 shows a generic defect eradicator system 10 that utilizes laser cleaning technology and wafer defect mapping technology/tooling/SEM defect revenue tooling and a cluster tooling main frame architecture. The system elements include the following: area laser cleaner station 11, 12 and laser point cleaner station 13, which may be apparatus as developed by Radiance Services Company, Bethesda, Md.; wafer mappers 18–22, which may be apparatus manufactured by KLA, 160 San Roblas, San Jose, Calif.; Scanning Electron Microscope—Defect Review Tool (SEM-DRT) 24, which may be apparatus manufactured by Amray, 160 Middlesex Turnpike, Bedford, Mass.; and computer-controlled cluster tooling 26 for wafer handling purposes including input and output ports 28, 30 respectively, which may be apparatus manufactured by Applied Materials, 350 Bowers Avenue, Santa Clara, Calif.

Optionally, the cluster tooling may include a wafer pre-clean station 34. Laser cleaner stations utilize the processes of either the present invention or of international patent application PCT/US98/10658, including the Radiance Processes described in the U.S.

Pat. Nos. 5,024,968, 5,099,557, 5,531,857, 5,643,472, 5,800,625, 5,821,175, and 5,958,268. Curved arrows in FIGS. 1, 3, and 4 show schematically the movement of wafers from station to station. The wafer yield enhancement/improvement system described in the following description will eradicate in-line IC defects and thereby increase IC yields and dramatically increase the individual wafer revenue potential by using the following process in the overall apparatus 10. Most of the stations of FIG. 4, 5, or 6 operate with gas atmospheres such as clean air. As is known in the art, some of the stations (e.g., wafer pre-clean station 34 and SEM-DRT 24) require vacuum for their operation, and therefore require conventional airlock interfaces.

The wafer cleaning apparatus of area laser cleaner station 11, 12 and laser point cleaner station 13, and the cleaning methods employed may be similar to those described in U.S. Pat. Nos. 5,024,968, 5,099,557, 5,531,857, and 5,643,472 (each in its entirety incorporated by reference herein). The specific apparatus details are shown in the descriptions and drawings of those patents and are not repeated in FIGS. 1–9 of the present application. Similar methods are also described in the articles by A. Engelsberg, "Particle Removal from Semiconductor Surfaces Using a Photon-Assisted, Gas-Phase Cleaning Process," Materials Research Society Symposium Proceedings, vol. 315, pp. 255–260, (1993) and "Laser-Assisted Cleaning Proves Promising," Precision Cleaning, May 1995, which are also incorporated herein by reference.

An assembly holds a substrate 120 (e.g., semiconductor wafer) from which surface particulate defects 130 are to be removed. A gas from a gas source is constantly flowed (160) over the wafer. The gas is inert to the wafer and is flowed across the wafer so as to bathe the wafer in a non-reactive gas environment. Preferably, the gas is a chemically inert gas such as helium, nitrogen or argon. An enclosure for holding the wafer communicates with a gas source through a series of tubes, valves, and a gas flow meter. The enclosure preferably comprises a stainless steel reaction cell fitted with opposing gas inlet and outlet ports. The enclosure is fitted with a sealed optical grade quartz window or light guide (e.g., a suitable fiber-optic light guide) through which the radiation can pass, or the laser could be placed within the enclosure. The inlet and outlet ports may comprise, for example, stainless steel tubing fitted with valves. After the wafer is transported into the enclosure, the enclosure is repeatedly flushed and backfilled with the gas and is kept at a pressure slightly above ambient atmospheric pressure to prevent inflow of other gases. Flow of the gas may be regulated by a flow meter such as a Matheson Model 602 flow meter. The valves are preferably metering valves, regulating valves, or bellows valves suitable for high temperature and pressure applications and for use with toxic, hazardous, corrosive or expensive gases or liquids, as for example, Swagelok SS4H sup TM series valves by Swagelok Co. of Solon, Ohio.

Each wafer is irradiated with high-energy irradiation 150 characterized by an energy density and duration between that required to release surface contaminants from the substrate treatment surface and that required to alter the crystal structure of the substrate treatment surface. According to the preferred embodiment, a laser generates laser irradiation which is directed against the wafer surface. The energy flux and the wavelength of the high-energy irradiation is preferably selected to be dependent upon the surface defects being removed. To this end, a gas analyzer may be connected to area laser cleaner station 11, 12 and laser point cleaner station 13. The gas analyzer analyzes the contents of exhaust gas from the enclosure to facilitate selective energy and wavelength adjustment of the laser. The gas analyzer may be a mass spectrometer as, for example, a quadrapole mass spectrometer manufactured by Bruker Instruments, Inc. of Billerica, Mass., or by Perkin Elmer of Eden Prairie, Minn.

Selection of the high-energy irradiation source for use in the invention depends upon the desired irradiation energy and wavelength. The electron volt/photon (eV/photon) energy of the irradiation is preferably at least twice the energy necessary to break the bonds adhering the particulate contaminants to the surface being cleaned. The bond energies between common contaminants such as particulates composed of compounds of carbon, hydrogen and oxygen, and common substrate materials such as silicon, titanium, germanium, iron, platinum and aluminum range between 2 and 7 eV/bond as disclosed in Handbook of Chemistry and Physics, 68th ed., pp. F-169 to F-177 (CRC Press 1987) which is hereby incorporated by reference. Accordingly, lasers emitting photons with energies in the range of 4 to 14 eV/photons are desirable. The wavelength should be outside a wavelength range that would compromise the integrity of the substrate surface by the photoelectric effect, as described in G. W. Castellan, Physical Chemistry, 2nd ed., 458–459 (Academic Press, 1975) which is hereby incorporated by reference. The preferred wavelength depends on the molecular species being removed and the resonance states of such species. The wavelengths and photon energies of a number of lasers operable in the invention are listed in Table 1 of U.S. Pat. Nos. 5,024,968 and 5,531,857, and Table 1c of U.S. Pat. No. 5,643,472. A number of those lasers are described in greater detail in the following references which are hereby incorporated by reference: M. J. Webber, ed., CRC Handbook of Laser Science, Vols. 1–5 (1982–1987); Mitsuo Maeda, Laser Dyes, (Academic Press 1984); and laser product literature from Lambda Physik, Inc., 3201 West Commercial Blvd., Ft. Lauderdale, Fla. 33309, from Coherent, Inc., 5100 Patrick Henry Drive, Santa Clara, Calif. 95054, and from Spectra-Physics, 1330 Terra Bella Ave., Mountain View, Calif. 94039–7013. Generally, preferred wavelengths are in the range from about 100 tm to about 700 nm, more preferably about 200 nm. Two particular preferred lasers are the KrF excimer laser with a wavelength of 248 rum and the ArF excimer laser with a wavelength of 193 nm. It is anticipated that high-energy xenon or mercury lamps or other types of lasers, including visible, ultraviolet, infrared, x-ray, or free-electron lasers, might be utilized as the irradiation source in the present invention. The irradiation energy density and duration of irradiation used is such that the heat of formation is not approached on the wafer surface. Finding the maximum energy usable on a given wafer material will require some experimentation in light of the material's known heat of formation. Thus, annealing, thermal ablation, and melting are prevented from occurring. When a wafer surface is irradiated as described above, the bonds and/or forces holding particulate defects to the substrate surface are broken and the inert carrier gas carries contaminants away from the substrate surface during laser irradiation. As long as the cleaned substrate remains in the inert gas environment, new contaminants will not form on the substrate surface. If necessary, a suitable trapping system may be connected to apparatus 10 (preferably at laser area clean stations 11 and 12 and laser pin-point clean station 13) for trapping and neutralizing removed contaminant species.

Ad The wafers being treated may be selectively exposed to the laser irradiation by a variety of methods. For example, the wafer may be fixed on an X-Y table which is selectively moved with respect to a fixed beam of laser pulses that are directed through a beam splitter and a focusing lens before contacting selected portions of the surface of the wafer over which inert gas flows. Alternatively, laser pulses may be split by beam splitters into two sets of pulses which are selectively moved by adjusting mirrors over the surface of the wafer on a fixed table. A laser power meter allows for close monitoring of the laser power being applied to the wafers. In general, the photons are preferably directed perpendicular to the plane of the portion of the wafer being treated, to maximize the power and energy fluxes at the surface for a given output from the source of photons. However, the photons may be directed at an angle to the wafer as convenient or necessary for implementation of the process. In some situations, it may be preferable to direct the radiation at an oblique angle to the wafer. Of course, the energy and power fluxes at the surface will vary with the angle of incidence of the photons with respect to the plane of the surface, and this variation must be taken into account in selecting the output of the photon source.

FIG. 4 shows an integrated system that incorporates all four tool elements.

Figure 5:
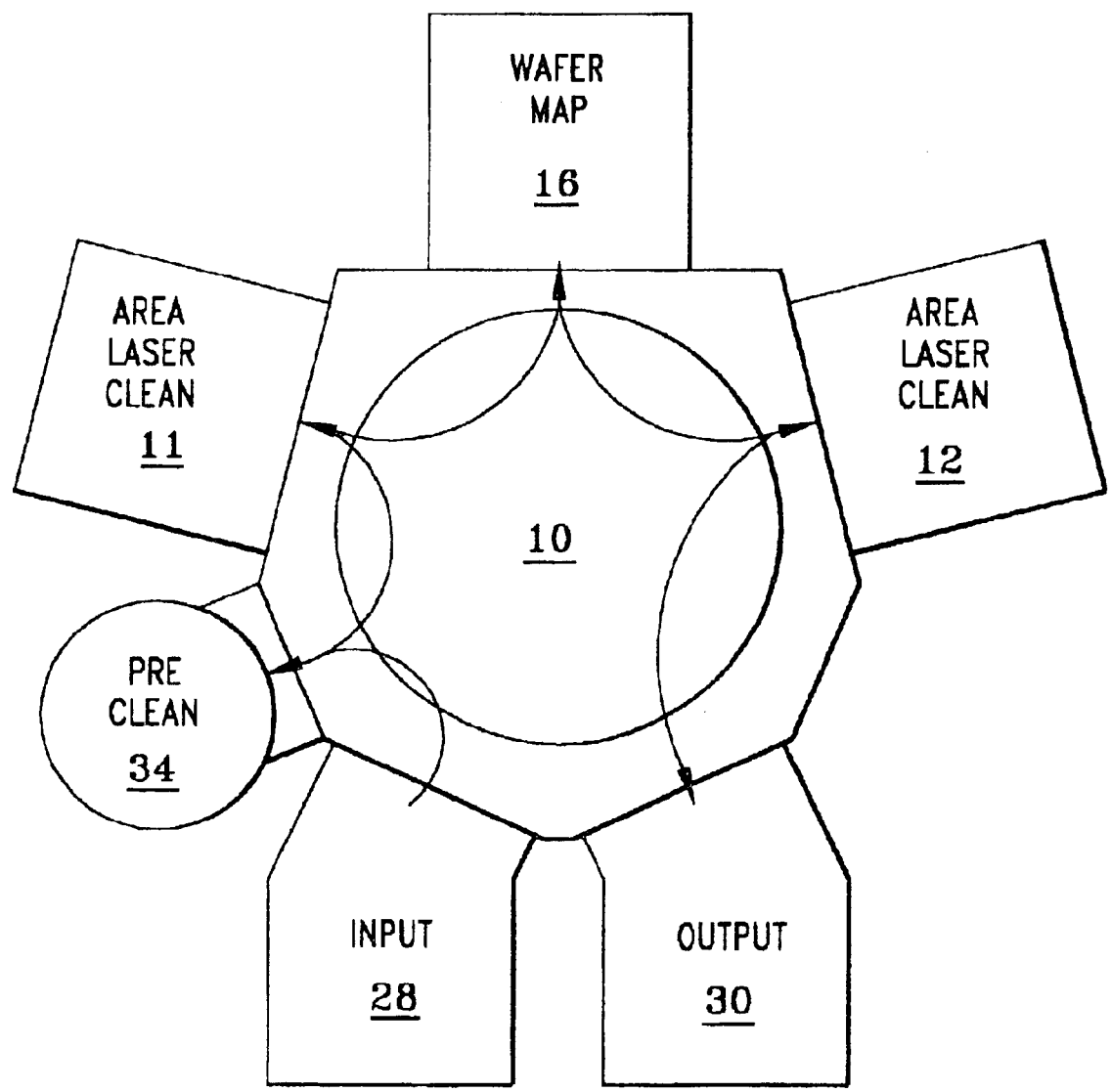
FIG. 5 is a plan view of a simplified manufacturing apparatus incorporating the principles of the present invention.
Figure 6:
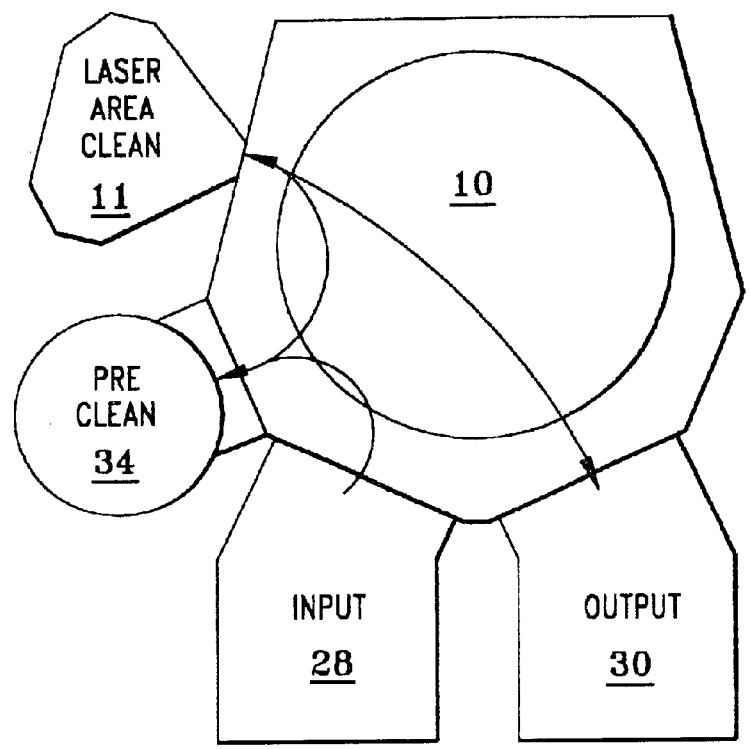
FIG. 6 is a plan view of another simplified manufacturing apparatus incorporating the principles of the present invention.

However, the four system elements may also be separated into individual "tools." Wafers would then be transported between the individual Midas Tool elements by using a mini-environment pod. Simplified configuration versions of the integrated system are shown in FIGS. 5 and 6. FIG. 5 is a plan view of a simplified "mid-range" manufacturing apparatus for use in the intermediate (rapid yield-improvement) stage of a typical semiconductor manufacturing process yield-improvement curve. FIG. 6 is a plan view of a further simplified "low-end" manufacturing apparatus for use in the latest (high yield) stage of a typical semiconductor manufacturing process yield-improvement curve.

Thus, one important aspect of the invention is an improved semiconductor wafer processing apparatus that includes a series of processing stations, in one form, coupled together by computer-controlled cluster tooling which is programmed to achieve a selected wafer throughput for the apparatus at a selected defect level in the range of at least 0.01 defects/cm$^2$. Wafers are supplied in a pod to an input station which initiates a data record for recording wafer processing results at each processing station. The individual wafers are transferred to a self-directed defect mapping station where wafer surface defects are identified and located in their x-y coordinates. The defect mapped wafers are transferred to a self-directed laser area cleaning station which lifts the defects and sweeps the wafer surface clean, except for stubborn defects. Clean wafers are transferred to a final mapping station where the wafer record is updated, followed by transfer of the wafers to an output station. Wafers having remaining stubborn defects are transferred to a second wafer defect mapping station where the stubborn defects are located in x-y coordinates, after which the wafers are transferred to a self-directed defect review tool incorporating a scanning electron microscope (SEM-DRT). An ultra high power wafer surface SEM image review of stubborn defects is performed including a chemical analysis of the stubborn defects, after which the wafers are routed to a self-directed laser point cleaning station which addresses each stubborn defect identified by x-y coordinates denoted in the data record accompanying the wafer. Optionally, the physical and/or chemical characteristics of each defect may be used for defect classification. Computer software programmed to perform automatic defect classification (ADC) is commercially available. The laser point cleaning station performs a defect removal operation by lifting and sweeping each stubborn defect from the wafer surface followed by transferring the cleaned wafers to a third wafer defect mapping station where any stubborn defects remaining are mapped in x-y coordinates and recorded in the accompanying data record, after which the wafers are transferred to a second laser area cleaning station wafer. A final cleaning is performed at the second laser area cleaning station followed by transfer of the wafers to a final mapping station for location in x-y coordinates of any remaining stubborn defects. The accompanying data records for the wafers are updated followed by transfer of the wafers to the output station.

The improved semiconductor wafer processing apparatus for cleaning a wafer surface and the like and removing contaminant particles 130 includes, in combination, means for applying a layer 140 of sacrificial material to the wafer surface 135, a laser for exposing the wafer to a photon flux 150 effective for removing the sacrificial material and the contaminant particles 130, and means for providing a flow of vapor or gas 160 across the wafer surface.

The method for overall cleaning of each wafer and removing contaminant particles includes the steps of applying a film of sacrificial material to the wafer (the sacrificial film comprising an inert film-forming substance, preferably collodion), exposing the film to light from a laser emitting light having an effective wavelength, while providing a flow of an inert gas across the wafer, to remove the sacrificial material film and the particles. The inert gas may be a mixture of nitrogen and argon, for example, in laminar flow. The sacrificial film is preferably applied as a solution of collodion in a solvent (e.g. a mixture of methanol and methyl ether), and the solvent is evaporated to leave a dry collodion film. Important characteristics of the sacrificial film are that it be substantially inert to the wafer, and that it be a good film-former. The sacrificial film solution may be applied by any of a number of known methods, such as spraying, casting, spinning, etc. Some sacrificial films may be applied by in-situ polymerization. One method for applying the sacrificial film solution to a wafer is described in U.S. Pat. No. 4,590,094 to Ringer. The effective wavelength of the laser light is preferably between about 100 nm and about 700 nm, more preferably about 200 nm, and most preferably about 248 nm (KrF excimer laser). Shorter wavelengths (higher energy) may sometimes be required, e.g., 193 nm (ArF excimer laser) or 157 nm ($F_2$ excimer laser). The laser light preferably irradiates the wafer surface at less than about 100 millijoules per square centimeter, pulsed with a pulse repetition rate (overlap) preferably between about 10–30 pulses/sec., most preferably about 20 pulses/sec., or at a rate sufficient to effectively remove the particulate contaminants in a reasonable time.

As mentioned above, it is known that not all particulates are equally undesirable. For example, particulates that adhere at some non-sensitive portions of the IC circuitry may have no effect on operation or performance and need not necessarily be removed ("don't cares" or "cosmetic" defects). Similarly, defects having innocuous physical and/or chemical characteristics may be cosmetic defects. On the other hand, particulates that adhere at locations where they would be critical to device operation ("killer defects") can cause test failure of the IC circuitry and must be removed for proper operation. Each mapped defect may optionally be further characterized by automatic defect classification, as its physical and chemical characteristics may be pertinent to whether the defect is a killer defect. The present invention is adaptable in two ways for selective removal of only killer defects. In the process whereby the positional coordinates of mapped defects are fed forward from the wafer mapper station 14, those coordinates are compared (by computer software) with device design data for identifying the killer defects critical to device operation, and the photon flux is then selectively applied only at the positional coordinates of the killer defects while ignoring other defects. Also, for selective removal of only killer defects, the sacrificial film material may be selectively deposited around the positional coordinates of mapped killer defects. However, the method including application of a sacrificial film over the entire surface of the wafer or at least over the entire portion of the wafer occupied by device chip structures, is preferred.

An important mode of operating the apparatus of the present invention is one in which a first overall cleaning of each wafer to remove particulate contaminants is performed using the sacrificial film process described above. Then any remaining "stubborn" defects are mapped at a wafer mapping station, the positional coordinates of each particle are fed forward to a subsequent laser cleaning station, and the mapped remaining particles are selectively removed by the process of international patent application PCT/US98/10658 (without using a sacrificial film). If desired, the selective removal may be restricted to "killer" defects, as described above. This operating mode, combining an overall laser cleaning including the sacrificial film with a selective laser cleaning without sacrificial film (but utilizing fed-forward particle-position data) has the advantage of avoiding problems attendant with selective deposition of sacrificial films to small areas.

Various other sequences of steps may be used. For example, the film of sacrificial material may be applied to the wafer surface before performing the step of locating contaminant particles on the wafer surface and recording the coordinates of each particle in a record. Then, using a laser adapted for selectively exposing the wafer surface to laser light at those coordinates of each particle according to that record, the wafer may be selectively exposed to laser light to selectively remove particles whose coordinates were recorded in the record. Any sacrificial film material remaining at other locations on the wafer may either be left in place if it is harmless, or it may be removed in an overall laser cleaning process as previously described or removed by "wet chemical" means such a dissolution and rinsing.

Figure 10:
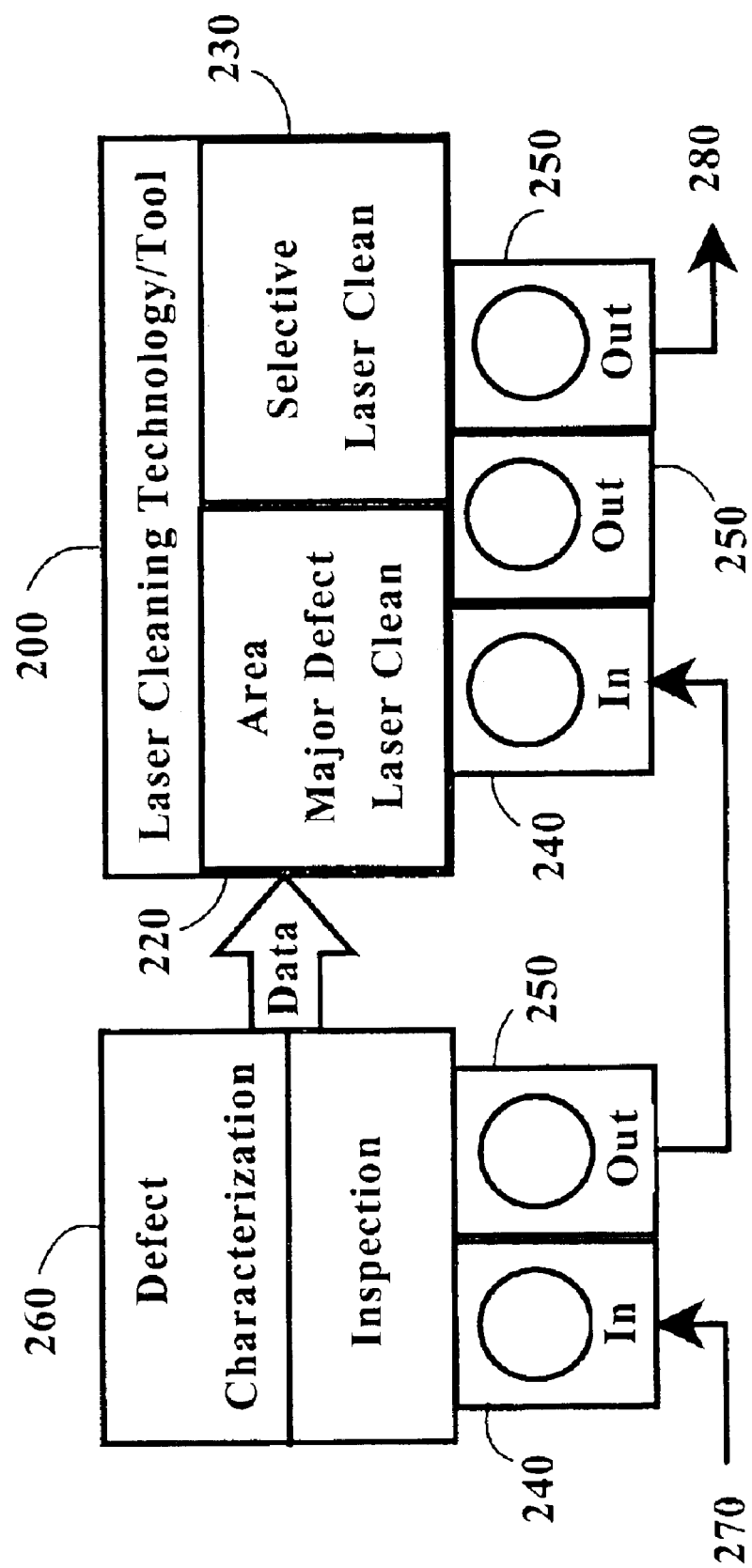
FIG. 10 is a schematic block diagram illustrating a preferred embodiment made in accordance with the invention in use.

FIG. 10 illustrates apparatus made in accordance with the invention, in use for semiconductor fabrication. A laser cleaning tool 200 incorporating the technology of the present invention includes capabilities for both area laser cleaning 220 and selective laser cleaning 230. Conventional SMIF interfaces can be used for input 240 and output 250 of semiconductor wafers, while protecting the wafers from contamination. Similar SMIF interfaces can provide input and output for an inspection and defect characterization station 260, which feeds data forward to laser cleaning tool 200 regarding the type, density, composition, and positions of particulate contaminants. Wafers enter inspection and defect characterization station 260 from an in-line checkpoint 270 of the overall process. After being cleaned by laser cleaning tool 200, wafers proceed to the next process step 280. It will be recognized that similar apparatus can be used for laser cleaning of masks, optical lenses, flat-panel displays, etc.

Figure 11:
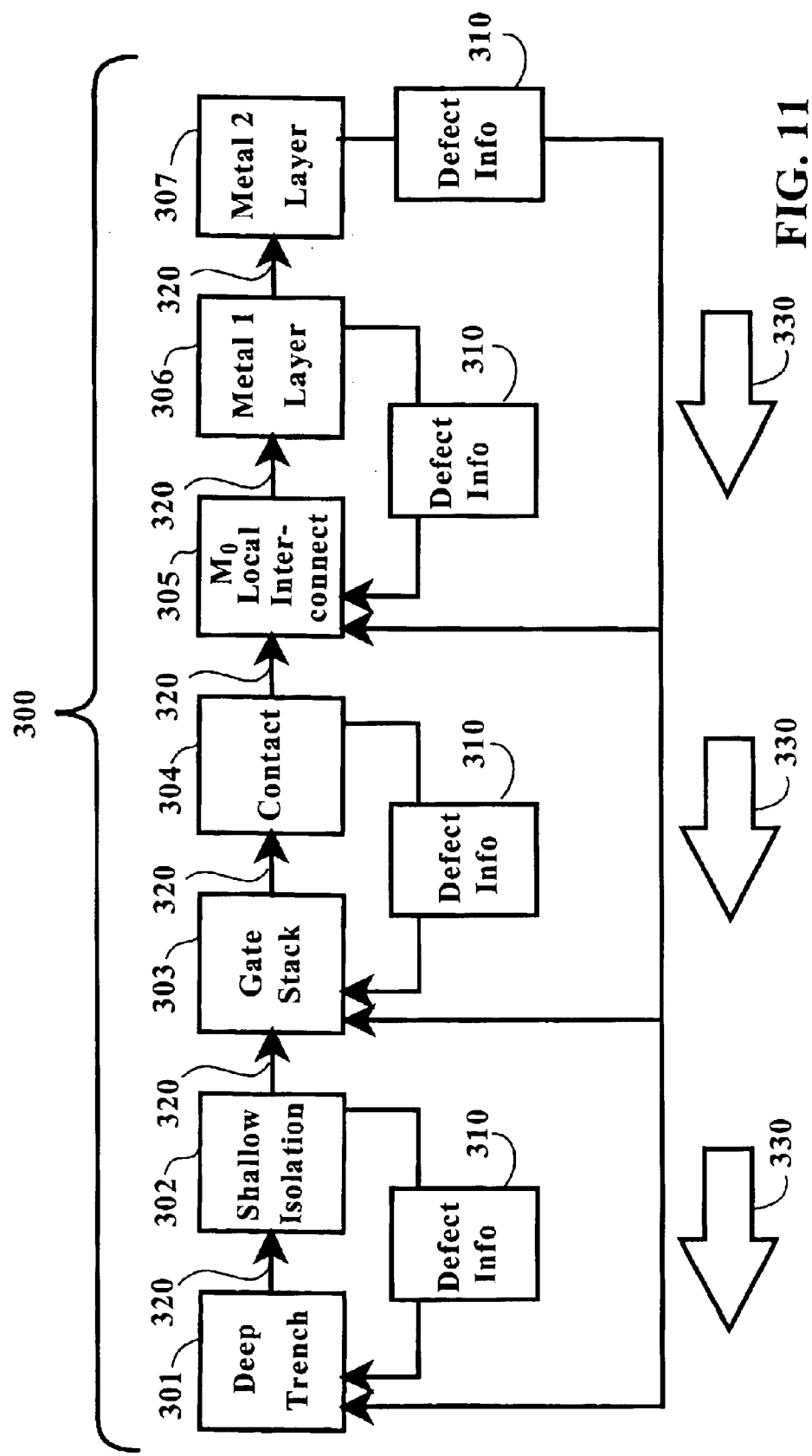
FIG. 11 is a flowchart illustrating flow of information in an example embodiment made in accordance with the invention.

FIG. 11 is a flowchart illustrating flow of information in an example of a semiconductor fabrication process 300 using the invention. The example overall process 300 includes several process steps: a deep trench process 301, a shallow isolation 302, a gate stack 303, a contact 304, an $M_0$ local interconnect 305, a metal layer 1 process 306, and a metal layer 2 process 307. Defect information 310 can be fed back from particular processes to earlier processes and fed forward (320) from earlier processes to later processes, along with the wafers characterized. Information 330 regarding the root causes of defects can also be fed back to earlier process steps. While the overall process diagram in FIG. 11 shows a particular sequence of individual processes, this sequence is merely illustrative of the types of process sequences that can benefit from use of the methods and apparatus of the present invention.

INDUSTRIAL APPLICABILITY

A manufacturing apparatus made in accordance with the invention is applicable to manufacturing processes that require extremely low defect densities, especially semiconductor wafer and photomask fabrication processes. The methods of the invention can be used to reduce defect densities of semiconductor wafers, thus increasing the yields and lowering the costs of the semiconductor products on the wafers. Similar apparatus suitably arranged can be used in the manufacture of masks, such as glass or quartz photolithography masks or membrane masks used for photolithography, X-ray lithography, electron projection lithography, or ion-projection lithography. The apparatus and methods may also be applied to cleaning of surfaces of precision optical elements such as lenses, prisms, diffraction gratings, or mirrors.

While the invention has been shown and described in connection with a preferred embodiment, various changes may be made therein without departing from the spirit and scope of the invention as defined in the appended claims. For example, various combinations of elements can be clustered in arrangements other than those shown, with suitable process sequences for moving wafers from one element to another. The order of performing steps of the processes may, of course, be varied.

What is claimed is:

1. A method of processing a substrate comprising:
   a) providing a substrate comprising patterns for electronic circuitry and contaminant particles on a surface;
   b) forming a solid sacrificial film on said surface;
   c) transferring energy to physically remove said sacrificial film from said surface, wherein removing said sacrificial film facilitates removing said contaminant particles from said surface.

2. The method as recited in claim 1, wherein said sacrificial film comprises an effective thickness for removal of said contaminant particles.

3. The method as recited in claim 1, wherein said contaminant particles have a size distribution ranging from a smallest diameter to a largest diameter, and wherein said sacrificial film comprises a thickness between one-tenth of said smallest diameter and twice said largest diameter.

4. The method as recited in claim 1, wherein said sacrificial film is formed by spraying a solution onto said substrate and drying a solvent in said solution to form said solid sacrificial film.

5. The method as recited in claim 1, wherein said sacrificial film is formed by spinning a solution onto said substrate and drying a solvent in said solution to form said solid sacrificial film.

6. The method as recited in claim 1, wherein said sacrificial film comprises nitrocellulose.

7. The method as recited in claim 1, wherein said forming of said sacrificial film comprises applying a solution of soluble nitrocellulose in a mixture of alcohol and ether.

8. The method as recited in claim 1, wherein said sacrificial film comprises pyroxylin.

9. The method as recited in claim 1, wherein said sacrificial film comprises collodion.

10. The method as recited in claim 1, wherein said transferring of energy is performed by exposing said sacrificial film to light having an effective wavelength for removing said sacrificial film.

11. The method as recited in claim 10, wherein said sacrificial film is comprises collodion and said effective wavelength is between about 150 and about 400 nanometers.

12. The method as recited in claim 10, wherein said light irradiate said substrate at less than about 100 millijoules per square centimeter.

13. The method as recited in claim 1, further comprising providing a flow of vapor across said substrate while performing said transferring of energy.

14. The method as recited in claim 13, wherein said flow of vapor is laminar flow.

15. The method as recited in claim 1, further comprising providing a flow of an inert gas across said substrate while performing said transferring of energy.

16. The method as recited in claim 15, wherein said inert gas is selected from the list consisting of nitrogen and argon.

17. The method as recited in claim 15, wherein said flow of an inert gas is laminar flow.

18. The method as recited in claim 1, wherein said sacrificial film comprises an organic material.

19. The method as recited in claim 18, wherein said sacrificial film comprises resist.

20. The method as recited in claim 10, wherein said light comprises a laser.

21. The method as recited in claim 20, wherein said comprises an excimer laser.

22. The method as recited in claim 20, wherein said laser comprises a pulsed UV laser.

23. The method as recited in claim 1, further comprising measuring said contaminant particles on said surface before forming said sacrificial film.

24. The method as recited in claim 23, wherein said measuring of said contaminant particles on said surface is performed by an advanced patterned wafer inspection system with an automatic defect classification program.

25. The method as recited in claim 23, wherein said measuring comprises measuring of type, size, composition, density, and position coordinates of said contaminant particles on said surface.

26. The method as recited in claim 25, wherein said measuring of composition comprises analyzing exhaust gas after removing said contaminant particles from said surface.

27. The method as recited in claim 25, wherein said measuring of composition comprises performing x-ray dispersive spectroscopy of said contaminant particles on said surface.

28. The method as recited in claim 23, further comprising selecting a parameter of said forming a sacrificial film or of said transferring of energy based on data from said measuring of said contaminant particles.

29. The method as recited in claim 28, wherein said selecting a parameter comprises selecting a parameter based on type or composition of said contaminant particles.

30. The method as recited in claim 29, wherein said selecting a parameter comprises selecting said energy to be transferred to be higher than that required to break bonds.

31. The method as recited in claim 23, wherein said measuring comprises providing a map of said contaminant particles on said surface.

32. The method as recited in claim 23, wherein said transferring of energy comprises aiming an energy beam at said position coordinates found by said measuring of said contaminant particles.

33. The method as recited in claim 32, wherein said energy beam comprises a laser beam and wherein said method further comprises selecting a contaminant-specific recipe for said laser induced removing of said contaminant particles based on data from said measuring of said contaminant particles.

34. The method as recited in claim 33, wherein said method further comprises selecting a generic recipe for laser induced removing of other major defects found in said measuring.

35. The method as recited in claim 33, wherein said contaminant-specific recipe is selected for each specific type of said contaminant particle characterized in said measuring and wherein said laser beam is directed to position coordinates on said surface where said specific contaminant particles are actually located as determined in said measuring.

36. The method as recited in claim 23, further comprising storing data generated by said measuring in a data record for said surface.

37. The method as recited in claim 23, further comprising measuring remaining contaminant particles on said surface after said transferring of energy.

38. The method as recited in claim 37, further comprising repeating said transferring of energy to remove said remaining contaminant particles.

39. The method as recited in claim 1, wherein said substrate is provided after a step in a process flow of fabricating the electronic circuitry on said surface but before other fabrication steps are complete.

40. The method as recited in claim 1, wherein said transferring of energy comprises an area cleaning.

41. The method as recited in claim 40, wherein said area cleaning is performed by providing a laser beam and scanning said laser beam or by scanning said substrate with respect to said laser beam.

42. The method as recited in claim 1, wherein the substrate is selected from a group consisting of a semiconductor wafer and a mask.

* * * * *